United States Patent
Nagase et al.

(10) Patent No.: US 10,854,252 B2
(45) Date of Patent: Dec. 1, 2020

(54) MAGNETIC STORAGE DEVICE WITH A STACK OF MAGNETIC LAYERS INCLUDING IRON (FE) AND COBALT (CO)

(71) Applicant: TOSHIBA MEMORY CORPORATION, Minato-ku, Tokyo (JP)

(72) Inventors: Toshihiko Nagase, Kuwana Mie (JP); Daisuke Watanabe, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 24 days.

(21) Appl. No.: 16/291,484

(22) Filed: Mar. 4, 2019

(65) Prior Publication Data

US 2020/0075072 A1    Mar. 5, 2020

(30) Foreign Application Priority Data

Aug. 31, 2018    (JP) .................................. 2018-163546

(51) Int. Cl.
| | |
|---|---|
| *G11C 11/16* | (2006.01) |
| *H01L 27/22* | (2006.01) |
| *H01L 43/10* | (2006.01) |
| *H01L 43/08* | (2006.01) |
| *H01L 43/12* | (2006.01) |

(52) U.S. Cl.
CPC ........ *G11C 11/161* (2013.01); *G11C 11/1655* (2013.01); *G11C 11/1657* (2013.01);
(Continued)

(58) Field of Classification Search
CPC ........... G11C 11/161; G11C 11/15–161; H01F 10/325; H01F 10/3272; H01F 10/3286;
(Continued)

(56) References Cited

U.S. PATENT DOCUMENTS 9,680,089 B1 *   6/2017   Chen ..................... G11C 11/161
2005/0094317 A1   5/2005   Funayama
(Continued)

FOREIGN PATENT DOCUMENTS

| JP | 2005136309 A | 5/2005 |
|---|---|---|
| JP | 2007067091 A | 3/2007 |
| JP | 2014022030 A | 2/2014 |

OTHER PUBLICATIONS

Yiming Huai, et al., "High performance perpendicular magnetic tunnel junction with Co/Ir interfacial anisotropy for embedded and standalone STT-MRAM applications," Applied Physics Letters, 112, (2018), pp. 092402-1 to 092402-5.

*Primary Examiner* — Younes Boulghassoul
(74) *Attorney, Agent, or Firm* — Holtz, Holtz & Volek PC

(57) ABSTRACT

According to one embodiment, a device includes an element including: a first stacked; a first nonmagnet on the first stacked; a second stacked on the first nonmagnet; a second nonmagnet on the second stacked; and a first magnet on the second nonmagnet. The second stacked including: a second magnet in contact with the second nonmagnet, including Fe and Co; a third nonmagnet at an opposite side of the second nonmagnet relative to the second magnet, including Mo or W; and a third magnet on the first nonmagnet, in contact with the third nonmagnet, including Fe and Co. An atomic ratio of Fe in the third magnet is lower than an atomic ratio of Fe in the second magnet.

18 Claims, 7 Drawing Sheets

(52) U.S. Cl.
CPC ...... *G11C 11/1673* (2013.01); *G11C 11/1675* (2013.01); *H01L 27/228* (2013.01); *H01L 43/08* (2013.01); *H01L 43/10* (2013.01); *H01L 43/12* (2013.01)

(58) Field of Classification Search
CPC ............... H01F 10/329; H01F 10/3295; H01F 10/324–3295; H01L 43/08; H01L 43/10; H01L 43/12
See application file for complete search history.

(56) References Cited

U.S. PATENT DOCUMENTS

| | | | | |
|---|---|---|---|---|
| 2012/0068285 A1* | 3/2012 | Kitagawa | ................. | H01L 43/12 257/421 |
| 2013/0010532 A1* | 1/2013 | Nagase | ............... | H01F 10/3272 365/158 |
| 2013/0299929 A1* | 11/2013 | Watanabe | ............. | G11C 11/161 257/421 |
| 2014/0016404 A1 | 1/2014 | Kim et al. | | |
| 2014/0124884 A1* | 5/2014 | Watanabe | ............... | H01L 43/10 257/421 |
| 2014/0284539 A1* | 9/2014 | Eeh | ......... | H01L 43/08 257/4 |
| 2015/0061053 A1* | 3/2015 | Nakayama | ............. | H01L 45/06 257/421 |
| 2015/0171315 A1* | 6/2015 | Gan | .................. | H01L 29/66984 257/421 |
| 2016/0211440 A1* | 7/2016 | Siddik | ..................... | H01L 43/08 |
| 2016/0380182 A1* | 12/2016 | Watanabe | ............. | H01L 27/228 257/427 |
| 2017/0222133 A1* | 8/2017 | Lim | ........................ | H01L 43/08 |
| 2017/0263858 A1* | 9/2017 | Sonoda | .................. | G11C 11/161 |
| 2018/0076383 A1* | 3/2018 | Sawada | ................... | H01L 43/12 |
| 2018/0248110 A1* | 8/2018 | Kardasz | .................. | H01L 43/08 |
| 2018/0322994 A1* | 11/2018 | Rahman | ................. | H01L 27/222 |
| 2019/0259810 A1* | 8/2019 | Jacob | .................... | H01L 27/228 |

* cited by examiner

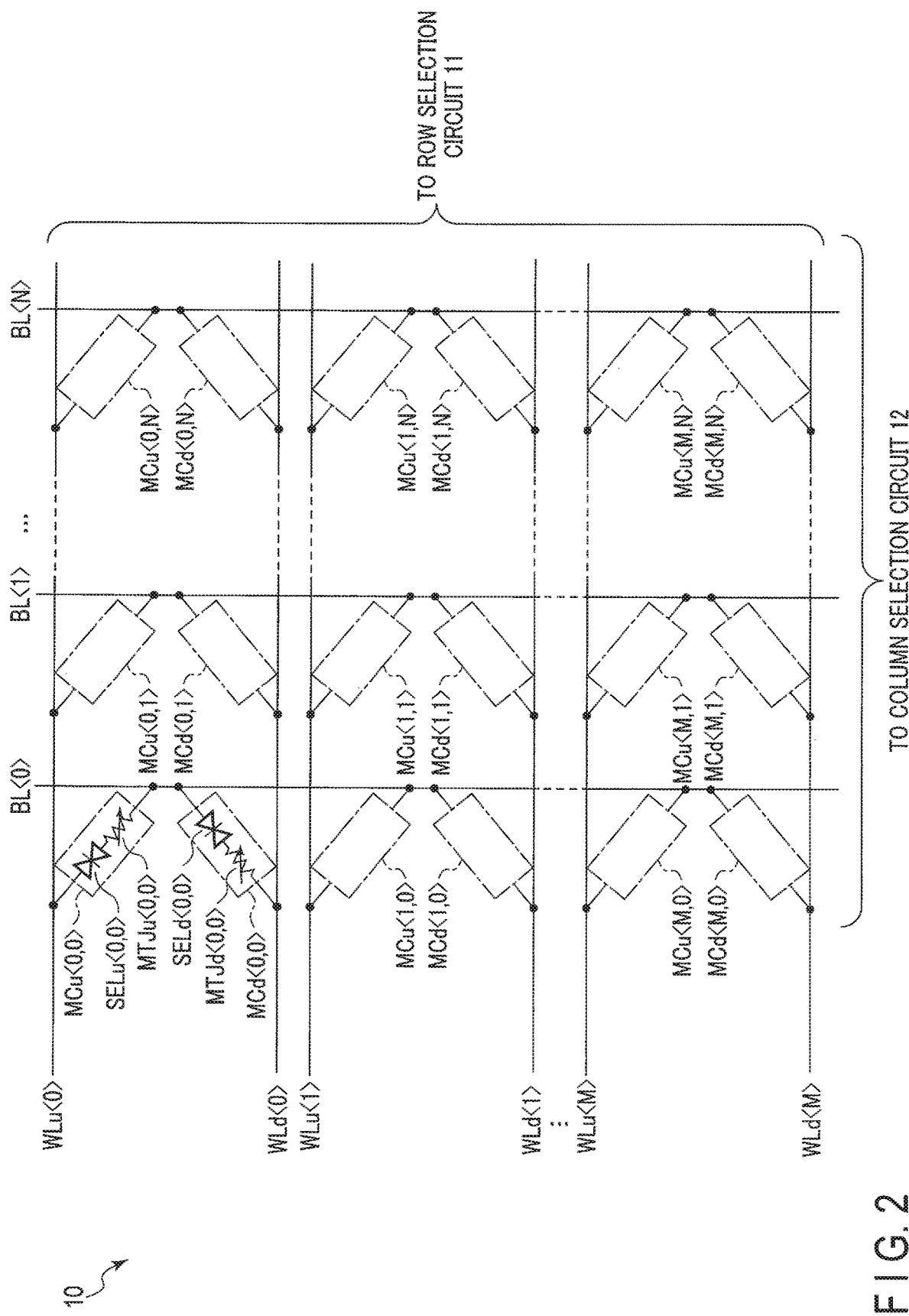
F I G. 2

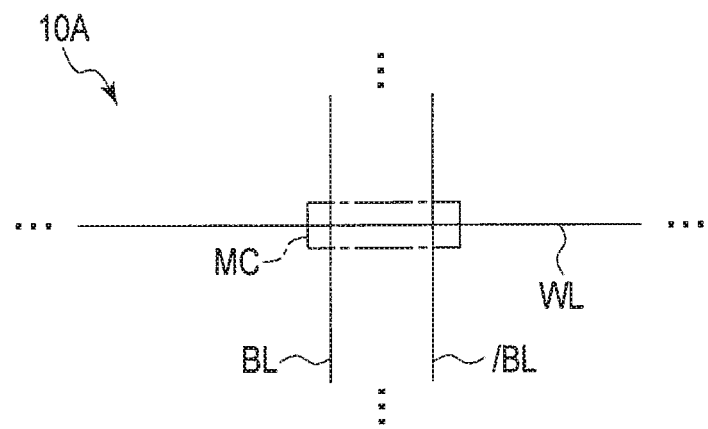
F I G. 8
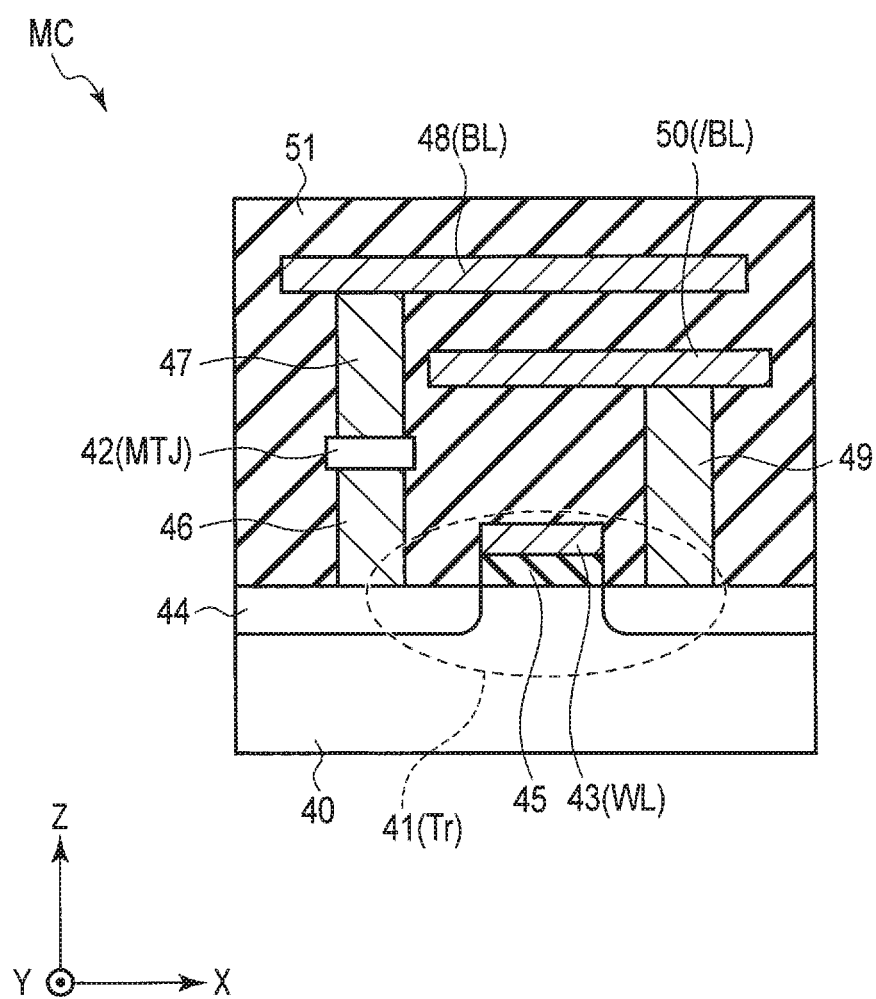
F I G. 9

MAGNETIC STORAGE DEVICE WITH A STACK OF MAGNETIC LAYERS INCLUDING IRON (FE) AND COBALT (CO)

CROSS-REFERENCE TO RELATED APPLICATIONS

This application is based upon and claims the benefit of priority from Japanese Patent Application No. 2018-163546, filed Aug. 31, 2018, the entire contents of which are incorporated herein by reference.

FIELD

Embodiments described herein relate generally to a magnetic storage device.

BACKGROUND

A magnetic storage device that has a magnetoresistive element is known.

BRIEF DESCRIPTION OF THE DRAWINGS

FIG. 2 is a circuit diagram to explain a configuration of a memory cell array of the magnetic storage device according to the first embodiment.

FIG. 8 is a circuit diagram to explain a configuration of a memory cell array of a magnetic storage device according to a modification.

FIG. 9 is a sectional view to explain a configuration of a memory cell of the magnetic storage device according to the modification.

DETAILED DESCRIPTION

In general, according to one embodiment, a magnetic storage device includes a magnetoresistive element. The magnetoresistive element including: a first stacked layers; a first non-magnetic layer on the first stacked layers; a second stacked layers on the first non-magnetic layer; a second non-magnetic layer on the second stacked layers; and a first magnetic layer on the second non-magnetic layer. The second stacked layers including: a second magnetic layer being in contact with the second non-magnetic layer, and including iron (Fe) and cobalt (Co); a third non-magnetic layer at an opposite side of the second non-magnetic layer relative to the second magnetic layer, and including an element selected from molybdenum (Mo) or tungsten (W); and a third magnetic layer on the first non-magnetic layer, being in contact with the third non-magnetic layer, and including iron (Fe) and cobalt (Co). An atomic ratio of iron (Fe) in the third magnetic layer is lower than an atomic ratio of iron (Fe) in the second magnetic layer.

Embodiments is explained with reference to the accompanying drawings. In the explanations below, structural components having equivalent functions and configurations will be denoted by the same reference symbols. If structural components indicated by the same reference symbols are distinguished, the reference symbols are accompanied by additional symbols. Such additional symbols may be omitted when differentiation is not needed for the structural components. The additional symbols includes not only subscripts or superscripts, but also, for example, lowercase alphabetical characters following the reference symbols, or indices representing array, etc.

1. First Embodiment

A magnetic device according to a first embodiment is described. The magnetic device according to the first embodiment includes, for example, a magnetic storage device (MRAM: Magnetoresistive Random Access Memory) by perpendicular magnetic recording using an element having a magnetoresistive effect (MTJ element, magnetoresistive effect element, or magnetoresistive element) by a magnetic tunnel junction (MTJ).

1. 1 Configuration

First, the configuration of a magnetic storage device according to the first embodiment is described.

1. 1. 1 Configuration of Magnetic Storage Device

Figure 1:
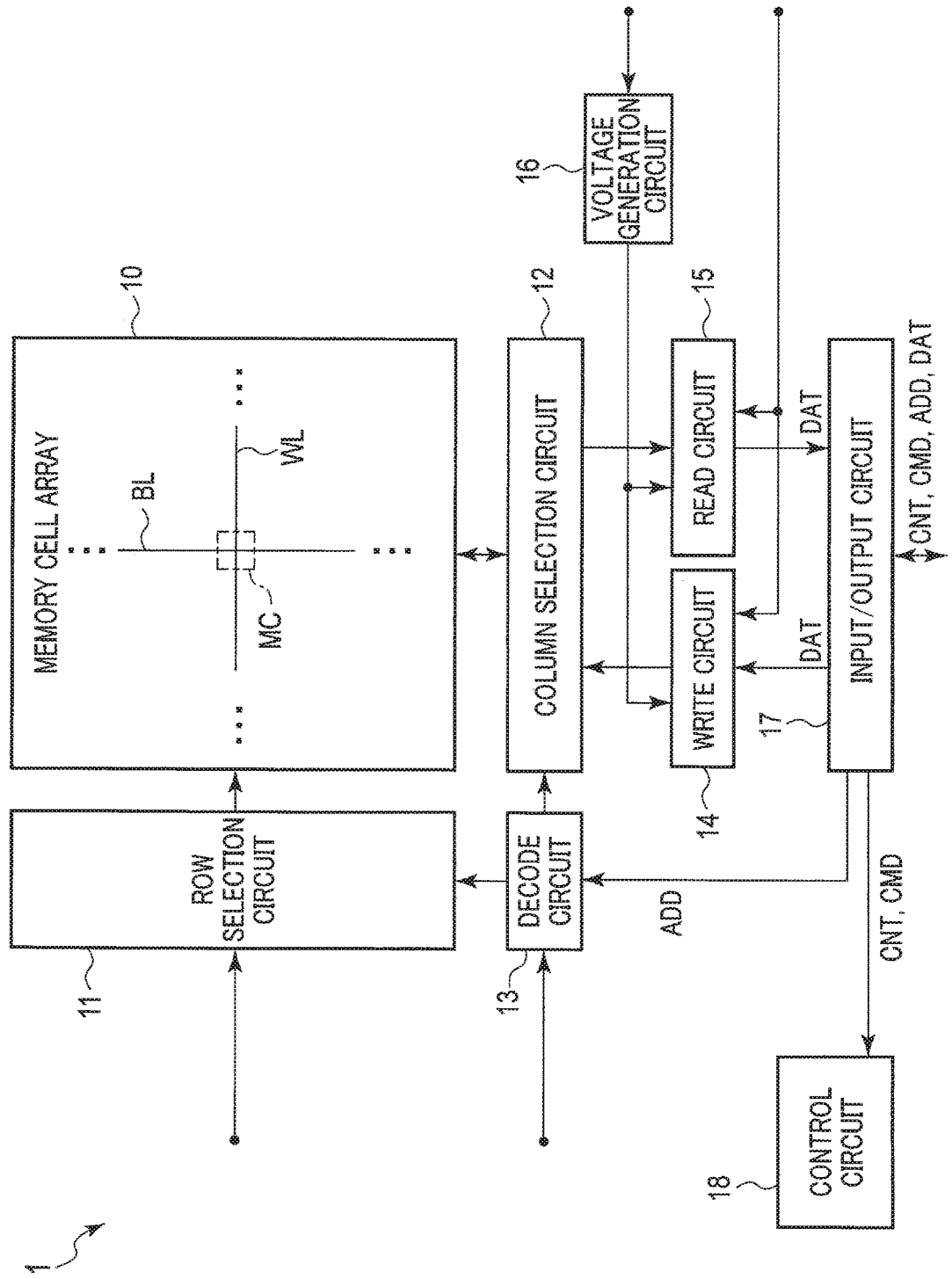
FIG. 1 is a block diagram to explain a configuration of a magnetic storage device according to a first embodiment.

FIG. 1 is a block diagram illustrating the configuration of a magnetic storage device according to the first embodiment. As shown in FIG. 1, the magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a set of a row and a column. Specifically, memory cells MC arranged in the same row are coupled to the same word line WL, and memory cells MC arranged in the same column are coupled to the same bit line BL.

The row selection circuit 11 is coupled to the memory cell array 10 via a word line WL. A decode result of an address ADD (row address) from the decode circuit 13 is supplied to the row selection circuit 11. The row selection circuit 11 sets a word line WL corresponding to a row based on the decode result of the address ADD in a selected state. In the following, a word line WL that has been set in the selected state is referred to as a selected word line WL. In addition, a word line WL other than the selected word line WL is referred to as an unselected word line WL.

The column selection circuit 12 is coupled to the memory cell array 10 via a bit line BL. A decode result of an address ADD (column address) from the decode circuit 13 is supplied to the column selection circuit 12. The column selection circuit 12 sets a column based on the decode result of the address ADD in a selected state. In the following, a bit line BL that has been set in the selected state is referred to as a selected bit line BL. In addition, a bit line BL other than the selected bit line BL is referred to as an unselected bit line BL.

The decode circuit 13 decodes an address ADD from the input/output circuit 17. The decode circuit 13 supplies a decode result of the address ADD to the row selection circuit 11 and the column selection circuit 12. The address ADD includes a column address and a row address to be selected.

The write circuit 14 writes data to a memory cell MC. The write circuit 14 includes, for example, a write driver (not illustrated).

The read circuit 15 reads data from a memory cell MC. The read circuit 15 includes, for example, a sense amplifier (not illustrated).

The voltage generation circuit 16 uses a power supply voltage supplied from an external device (not illustrated) of the magnetic storage device 1 to generate voltages for various types of operations of the memory cell array 10. For example, the voltage generation circuit 16 generates voltages required for writing operation, and outputs the voltages to the write circuit 14. For example, the voltage generation circuit 16 generates voltages required for reading operation, and outputs the voltages to the read circuit 15.

The input/output circuit 17 transfers the address ADD from the external device of the magnetic storage device 1 to the decode circuit 13. The input/output circuit 17 transfers a command CMD from the external device of the magnetic storage device 1 to the control circuit 18. The input/output circuit 17 transmits and receives various types of control signals CNT between the external device of the magnetic storage device 1 and the control circuit 18. The input/output circuit 17 transfers data DAT from the external device of the magnetic storage device 1 to the write circuit 14, and outputs data DAT transferred from the read circuit 15 to the external device of the magnetic storage device 1.

The control circuit 18 controls the operations of the row selection circuit 11, the column selection circuit 12, the decode circuit 13, the write circuit 14, the read circuit 15, the voltage generation circuit 16, and the input/output circuit 17 in the magnetic storage device 1, based on control signals CNT and commands CMD.

1. 1. 2 Configuration of Memory Cell Array

Next, the configuration of the memory cell array of the magnetic storage device according to the first embodiment is described with reference to FIG. 2. FIG. 2 is a circuit diagram illustrating the configuration of the memory cell array of the magnetic storage device according to the first embodiment. In FIG. 2, the word lines WL are distinguished by additional symbols including two lowercase alphabetical characters ("u" and "d") and indices ("< >").

As shown in FIG. 2, the memory cells MC (MCu and MCd) are arranged in a form of a matrix within the memory cell array 10, each of which is associated with a set of one of the bit lines BL (BL<0>, BL<1>, . . . , BL<N>) and one of word lines WLd (WLd<0>, WLd<1>, . . . , WLd<M>) and word lines WLu (WLu<0>, WLu<1>, . . . , WLu<M>) (M and N each are any integer). Namely, a memory cell MCd<i, j> (0≤i≤M, 0≤j≤N) is coupled between a word line WLd<i> and a bit line BL<j>, and a memory cell MCu<i, j> is coupled between a word line WLu<i> and a bit line BL<j>.

The additional symbols "d" and "u" respectively indicate a word line arranged at a lower part relative to a bit line BL, and a word line arranged at an upper part relative to a bit line BL, for the sake of convenience. An example of a three-dimensional configuration of the memory cell array 10 is described later.

A memory cell MCd<i, j> includes a switching element SELd<i, j> and a magnetoresistive element MTJd<i, j> connected in series. A memory cell MCu<i, j> includes a switching element SELu<i, j> and a magnetoresistive element MTJu<i, j> connected in series.

A switching element SEL has a function of a switch that controls a current supplied to a magnetoresistive element MTJ at a time of writing and reading data relative to the corresponding magnetoresistive element MTJ. Specifically, for example, a switching element SEL in a memory cell MC blocks a current (off state) flow by functioning as an insulator which has a high resistance value if a voltage applied to the memory cell MC falls below a voltage threshold Vth, and allows a current flow (on state) by functioning as a conductor which has a low-resistance value if a voltage applied to the memory cell MC exceeds the voltage threshold Vth. Namely, the switching element SEL has a function of switching between blocking or allowing a current flow in accordance with a value of a voltage to be applied to the memory cell MC, regardless of the direction of current flow.

The switching element SEL may be, for example, a switch element between two terminals. When the voltage applied between two terminals is equal to or lower than a threshold, the switch element is in a "high resistance" state, for example, an electrically non-conductive state. If the voltage to be applied between two terminals is equal to or higher than the threshold, the switch element is turned to a "low resistance" state, for example, an electrically conductive state. The switch element may have this function regardless of the polarity of the voltage. The switch element contains at least one type of chalcogen element selected from a group consisting of tellurium (Te), selenium (Se), and sulfur (S). Alternatively, the switch element may contain chalcogenide which is a compound containing the chalcogen element. The switch element may include at least one or more elements selected from a group consisting of boron (B), aluminum (Al), gallium (Ga), indium (In), carbon (C), silicon (Si), germanium (Ge), tin (Sn), arsenic (As), phosphorus (P), and antimony (Sb).

The magnetoresistive element MTJ can switch a resistance value between a low-resistance state and a high-resistance state, by a current, the amount of which is controlled by the switching element SEL. The magnetoresistive element MTJ is capable of writing data by a change of the resistance state, and functions as a memory element that is capable of storing written data in a non-volatile manner, and capable of reading data in accordance with the change of the resistance state.

Figure 3:
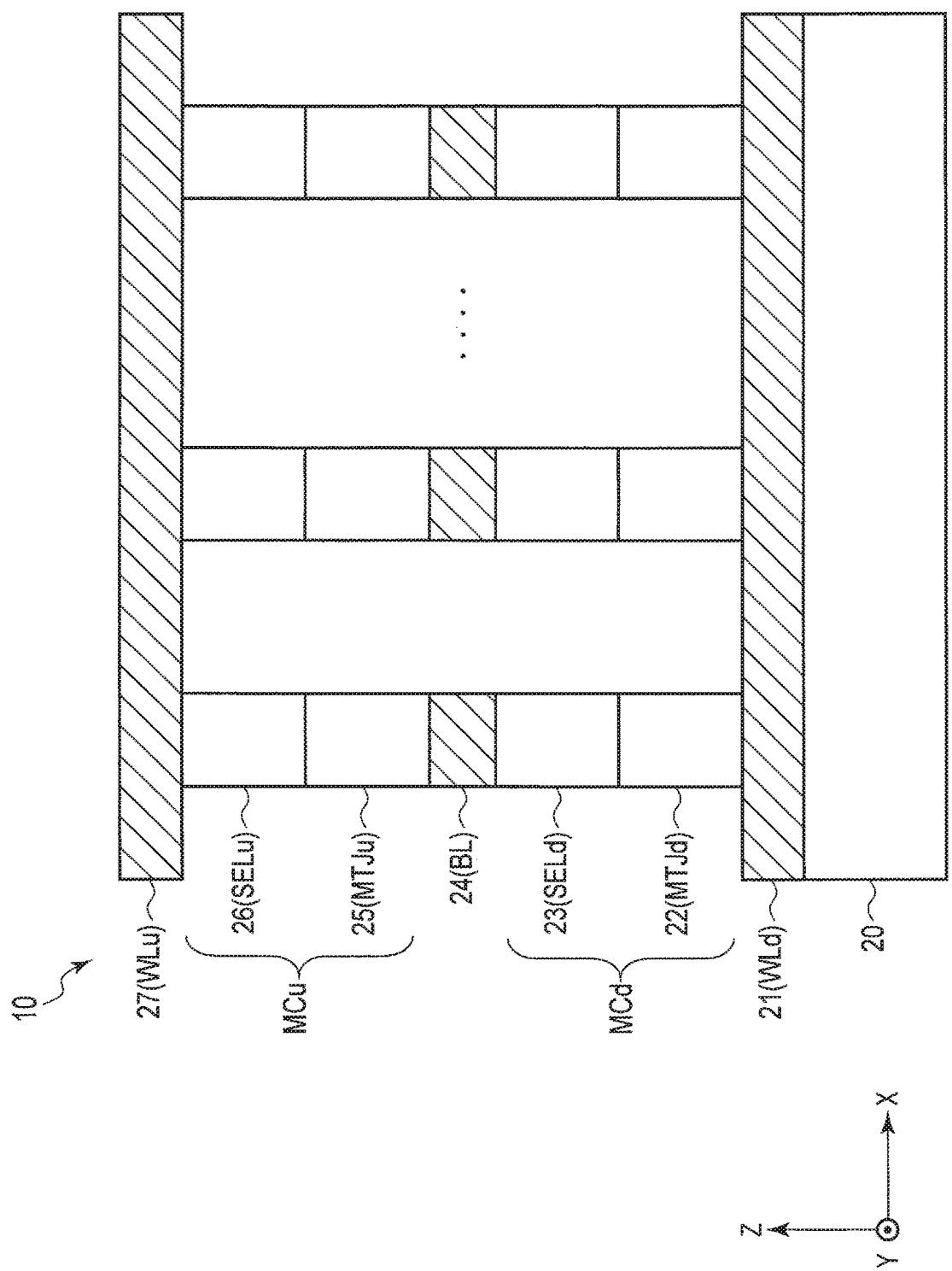
FIG. 3 is a sectional view to explain the configuration of the memory cell array of the magnetic storage device according to the first embodiment.

Next, a cross-sectional configuration of the memory cell array 10 is described with reference to FIG. 3. FIG. 3 illustrates an example of a cross-sectional configuration of the memory cell array of the magnetic storage device according to the first embodiment, taken along a word line.

As shown in FIG. 3, the magnetic storage device 1 is disposed on a semiconductor substrate 20. In the following description, a plane parallel to the surface of the semiconductor substrate 20 is represented as an XY plane, and a direction perpendicular to the XY plane is represented as a Z-direction. A direction along a word line WL is represented as an X-direction, and a direction along a bit line BL is represented as a Y-direction.

For example, a plurality of conductors 21 each functioning as a word line WLd are disposed on the upper surface of the semiconductor substrate 20. The conductors 21, for example, are arranged along the Y-direction, and each extend along the X-direction. FIG. 3 illustrates one of the conductors 21. A plurality of elements 22 each functioning as a magnetoresistive element MTJd are disposed on the upper surface of one conductor 21, for example, along the X-direction. Namely, elements 22 arranged along the X-direction are commonly coupled with one conductor 21. An element 23 functioning as a switching element SELd is disposed on the upper surface of each of the elements 22. A conductor 24 functioning as a bit line BL is disposed on the upper surface of each of the elements 23. The conductors 24, for example, are arranged along the X-direction, and each extend along the Y-direction. Namely, elements 23 arranged along the Y-direction are commonly coupled with one conductor 24.

A plurality of elements 25 each functioning as a magnetoresistive element MTJu are disposed on the upper surface of each of the conductors 24. Namely, the elements 25 arranged along the Y-direction are commonly coupled with one conductor 24. The element 25 has a functional structure equivalent to that of the element 22, for example. An element 26 functioning as a switching element SELu is disposed on the upper surface of each of the elements 25. The element 26 has a functional structure equivalent to that of the element 23, for example. A conductor 27 functioning as a word line WLu is disposed on the upper surface of each of the elements 26 arranged along the X-direction. A plurality of the conductors 27 are arranged along the Y-direction. The conductors 27, for example, each extend along the X-direction.

As can be seen from the aforementioned configuration, the memory cell array 10 has the configuration that a set of two word lines WLd and WLu is associated with a bit line BL. The memory cell array 10 has a stacked cross-point configuration where a memory cell MCd is disposed between a word line WLd and a bit line BL, and a memory cell MCu is disposed between a bit line BL and a word line WLu. In the stacked cross-point configuration illustrated in FIG. 3, a memory cell MCd is associated with a lower layer, and a memory cell MCu is associated with an upper layer. Namely, among two memory cells MC commonly coupled with a single bit line BL, a memory cell MC disposed in an upper layer of the bit line BL corresponds to a memory cell MCu having an additional symbol "u", and a memory cell MC disposed in a lower layer of the bit line BL corresponds to a memory cell MCd having an additional symbol "d".

In an example of FIG. 3, the conductor 21, elements 22 and 23, conductor 24, elements 25 and 26, and conductor 27 are in contact with each other; however, other elements may be disposed between each of the above elements.

1. 1. 3 Configuration of Magnetoresistive Element

Next, the configuration of the magnetoresistive element of the magnetic storage device according to the first embodiment is described with reference to FIG. 4.

1. 1. 3. 1 Entire Configuration of Magnetoresistive Element

Figure 4:
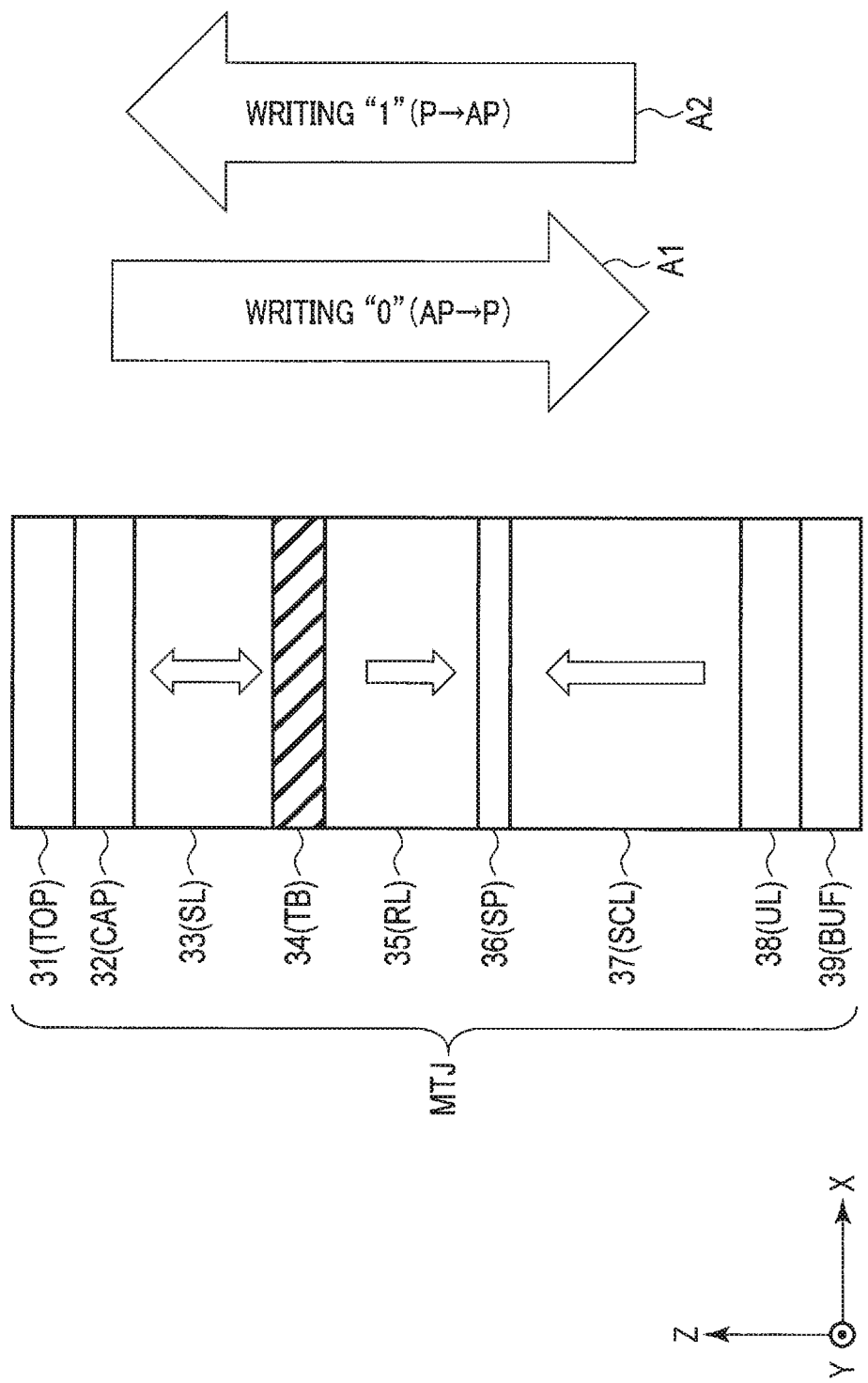
FIG. 4 is a sectional view to explain an entire configuration of a magnetoresistive element of the magnetic storage device according to the first embodiment.

FIG. 4 is a cross-sectional view illustrating an entire configuration of a magnetoresistive element of the magnetic storage device according to the first embodiment. FIG. 4 illustrates, for example, an example of a cross section of the magnetoresistive element MTJ (i.e., element 22 or 25) shown in FIG. 3, taken along a plane perpendicular to the Z-direction (for example, an XZ plane).

As shown in FIG. 4, each of elements 22 and 25 includes a non-magnetic layer 31 functioning as a top layer TOP, a non-magnetic layer 32 functioning as a cap layer CAP, a ferromagnetic layer 33 functioning as a storage layer SL, a non-magnetic layer 34 functioning as a tunnel barrier layer TB, a stacked layers 35 functioning as a reference layer RL, a non-magnetic layer 36 functioning as a spacer layer SP, a stacked layers 37 functioning as a shift cancelling layer SCL, a non-magnetic layer 38 functioning as an underlayer UL, and a non-magnetic layer 39 functioning as a buffer layer BUF.

In elements 22 and 25, a plurality of materials (non-magnetic layer 39, non-magnetic layer 38, stacked layers 37, non-magnetic layer 36, stacked layers 35, non-magnetic layer 34, ferromagnetic layer 33, non-magnetic layer 32, and non-magnetic layer 31, in the order given from the semiconductor substrate 20 side) are stacked from the word line WLd side to the bit line BL side, and from the bit line BL side to the word line WLu side (in the Z-axis direction), respectively. The elements 22 and 25 each function as, for example, a perpendicularly magnetized MTJ element in which the magnetization direction of the ferromagnetic layer forming the elements 22 and 25 is perpendicular to the film surface.

The non-magnetic layer 31 is a non-magnetic conductor that has a function as a top electrode that improves electrical connectivity between an upper end of the magnetoresistive element MTJ and a bit line BL or a word line WL. The non-magnetic layer 31 includes, for example, at least one element or compound selected from a group consisting of tungsten (W), tantalum (Ta), tantalum nitride (TaN), titanium (Ti), and titanium nitride (TiN).

The non-magnetic layer 32 is a non-magnetic layer which has a function of suppressing an increase of a damping constant of the ferromagnetic layer 33 and reducing a write current. The non-magnetic layer 32 includes, for example, at least one nitride or oxide selected from a group consisting of magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The non-magnetic layer 32 may be a mixture of these nitrides or oxides. Namely, the non-magnetic layer 32 may not necessarily be a binary compound consisting of two elements, but may be a ternary compound consisting of three elements, such as titanium aluminum nitride (AlTiN).

The ferromagnetic layer 33 has ferromagnetic properties, and has an easy axis of magnetization in a direction perpendicular to the film surface. The ferromagnetic layer 33 has a magnetization direction toward either of the bit line BL side or the word line WL side. The ferromagnetic layer 33 includes, for example, cobalt-iron-boron (CoFeB) or iron boride (FeB), and may have a body-centered cubic (bcc) crystal structure.

The non-magnetic layer 34 is a non-magnetic insulation film which includes, for example, magnesium oxide (MgO). The non-magnetic layer 34 is disposed between the ferromagnetic layer 33 and the stacked layers 35, and these layers 33, 34, and 35 form a magnetic tunnel junction.

The stacked layers 35 is a multi-layered film having multiple ferromagnetic layers, and has an easy axis of magnetization in a direction perpendicular to the film surface. Overall, the stacked layers 35 has one magnetization direction toward either of the bit line BL side or the word line WL side. The magnetization direction of the stacked layers 35 is fixed, and is directed to the stacked layers 37 in the example of FIG. 4. The expression, "magnetization direction is fixed", means that the magnetization direction is not changed due to the amount of current (spin torque) that may be able to reverse the magnetization direction of the ferromagnetic layer 33. The detailed stacked structure of the stacked layers 35 is described later.

The non-magnetic layer 36 is a non-magnetic conductive film which includes, for example, iridium (Ir).

The stacked layers 37 is a multi-layered film having multiple ferromagnetic layers, and has an easy axis of magnetization in a direction perpendicular to the film surface. Overall, the stacked layers 37 has one magnetization direction toward either of the bit line BL side or the word line WL side. The magnetization direction of the stacked layers 37 is fixed, and is directed to the stacked layers 35 in the example of FIG. 4. The detailed stacked structure of the stacked layers 37 is described later.

The two stacked layers 35 and 37 are anti-ferromagnetically coupled by the non-magnetic layer 36. Namely, the two stacked layers 35 and 37 are coupled so as to have mutually antiparallel magnetization directions. Accordingly, in the example of FIG. 4, the magnetization direction of the stacked layers 35 is directed to the stacked layers 37. The coupled structure of the stacked layers 35, non-magnetic layer 36, and stacked layers 37 is referred to as a SAF (Synthetic Anti-Ferromagnetic) structure. Via this structure, the stacked layers 37 can cancel an influence of the leakage magnetic field (stray field) of the stacked layers 35 to the magnetization direction of the ferromagnetic layer 33. Accordingly, the occurrence of asymmetry in magnetization reversal probability due to an external factor caused by stray field of the stacked layers 35, etc. (namely, the probability of reversal of magnetization direction is different in one direction and in an opposite direction) in the ferromagnetic layer 33 is suppressed.

The non-magnetic layer 38 is a non-magnetic conductive film, and functions as an underlayer to improve a crystal orientation of the stacked layers 37. The non-magnetic layer 38 includes, for example, ruthenium (Ru).

The non-magnetic layer 39 is a non-magnetic conductive film which has a function as a bottom electrode that improves electrical connectivity between a second end of the magnetoresistive element MTJ and a bit line BL or a word line WL. The non-magnetic layer 39 includes, for example, metal with high melting temperature such as tantalum (Ta) in view of thermal endurance.

In the first embodiment, a spin-transfer-torque writing is adopted in which a write current is directly supplied to the magnetoresistive element MTJ, a spin torque is transferred into the storage layer SL and the reference layer RL by the write current, and the magnetization directions of the storage layer SL and the reference layer RL are controlled. The magnetoresistive element MTJ can be one of a low-resistance state and a high-resistance state, depending on whether the magnetization directions of the storage layer SL and the reference layer RL are parallel or antiparallel.

If a write current Iw0 of a certain amount that flows in the direction indicated by arrow A1 in FIG. 4, in other words, the direction from the storage layer SL toward the reference layer RL, is supplied to the magnetoresistive element MTJ, the magnetization directions of the storage layer SL and the reference layer RL become parallel. In this parallel state, the resistance value of the magnetoresistive element MTJ becomes lowest, and the magnetoresistive element MTJ is set to a low-resistance state. This low-resistance state is called a "P (Parallel) state", and is defined, for example, as a state of data "0".

If a write current Iw1 greater than the write current Iw0 that flows in the direction indicated by arrow A2 in FIG. 4, in other words the direction from the reference layer RL toward the storage layer SL (the opposite direction as arrow A1), is supplied to the magnetoresistive element MTJ, the magnetization directions of the storage layer SL and the reference layer RL become antiparallel. In this antiparallel state, the resistance value of the magnetoresistive element MTJ becomes highest, and the magnetoresistive element MTJ is set to a high-resistance state. This high-resistance state is called an "AP (Anti-Parallel) state", and is defined, for example, as a state of data "1".

The descriptions below follow the aforementioned data-defining method; however, the method defining data "1" and data "0" is not limited to the aforementioned method. For example, the P state may be defined as data "1", and the AP state may be defined as data "0".

1. 1. 3. 2 Configuration of Reference Layer and Shift Cancelling Layer

Figure 5:
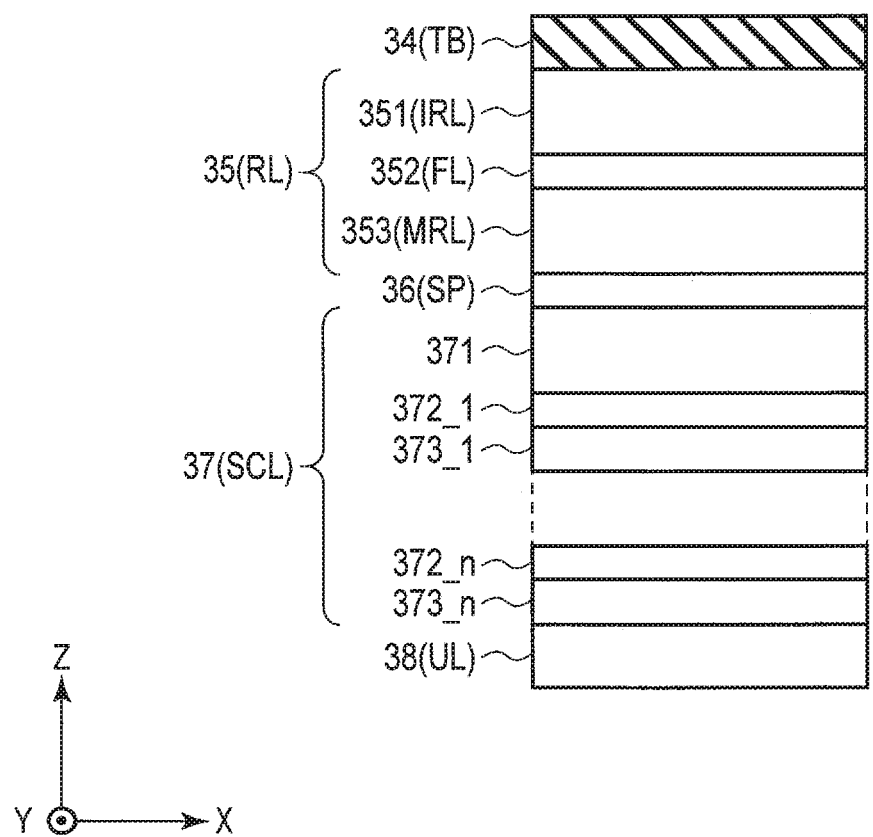
FIG. 5 is a sectional view to explain a detailed configuration of a part of the magnetic storage device which includes a reference layer and a shift cancelling layer, according to the first embodiment.

FIG. 5 is a cross-sectional view illustrating a detailed configuration of a part of the magnetoresistive element of the magnetic storage device which includes a reference layer and a shift cancelling layer, according to the first embodiment.

As shown in FIG. 5, the stacked layers 35 includes a ferromagnetic layer 351 which functions as an interface reference layer IRL, a non-magnetic layer 352 which functions as a function layer FL, and a ferromagnetic layer 353 which functions as a main reference layer MRL. The ferromagnetic layer 353, the non-magnetic layer 352, and the ferromagnetic layer 351 are disposed between the non-magnetic layer 36 and the non-magnetic layer 34, in the order given from the semiconductor substrate 20 side.

The ferromagnetic layer 351 has ferromagnetic properties, and has an easy axis of magnetization in a direction perpendicular to the film surface. The ferromagnetic layer 351 has a (001) crystal orientation same as the non-magnetic layer 34, in particular, in the non-magnetic layer 34 side, and accordingly, the ferromagnetic layer 351 has high interface magnetic anisotropy on the interface with the non-magnetic layer 34. The ferromagnetic layer 351 includes, for example, cobalt-iron-boron (CoFeB), and includes, in particular, a large amount of iron (Fe) (Fe-rich). In other words, the atomic ratio of iron (Fe) included in the ferromagnetic layer 351 is greater than the atomic ratio of cobalt (Co).

The non-magnetic layer 352 is a non-magnetic material which includes, for example, molybdenum (Mo) or tungsten (W). The non-magnetic layer 352 may further include boron (B). The non-magnetic layer 352 has an amorphous structure, but does not have a clear crystal structure. Accordingly, the non-magnetic layer 352 has a function of suppressing disturbance of the (001) crystal orientation of the ferromagnetic layer 351 by the stacked layers 37 that has an fcc (111) crystal orientation and/or an hcp (0002) crystal orientation different from the ferromagnetic layer 351. Namely, the non-magnetic layer 352 has a function of suppressing crystallization of the ferromagnetic layer 351 from the stacked layers 37 side when the ferromagnetic layer 351 is crystallized.

The ferromagnetic layer 353 has ferromagnetic properties, and has an easy axis of magnetization in a direction perpendicular to the film surface. The ferromagnetic layer 353 is magnetically coupled with the ferromagnetic layer 351 via the non-magnetic layer 352 so that the ferromagnetic layer 353 has the same magnetization direction with the ferromagnetic layer 351. The ferromagnetic layer 353 has, for example, a film thickness of approximately 0.7 nanometers (nm) (preferably, 0.5 nanometers or more and 1 nanometer or less), and includes cobalt iron (CoFe), in particular, a large amount of cobalt (Co) (Co-rich). In other words, the atomic ratio of cobalt (Co) included in the ferromagnetic layer 353 is greater than the atomic ratio of iron (Fe). Specifically, the atomic ratio of iron (Fe) in the ferromagnetic layer 353 is preferably, for example, approximately 20 at % (15 at % or more and 25 at % or less). The atomic ratio of iron (Fe) in the stacked layers 35 is greater in the ferromagnetic layer 351 in comparison with the ferromagnetic layer 353. The ferromagnetic layer 353 may further include boron (B). Accordingly, the amorphous state or the microcrystal state can be maintained in the ferromagnetic layer 353, and the flatness of the film is ensured.

The stacked layers 37 includes ferromagnetic layer 371, and a periodic structure of n-periods of non-magnetic layers 372 (372_1 to 372_n) and n-periods of ferromagnetic layers 373 (373_1 to 373_n) (n is any natural number). The number of periods can be discretionarily determined to adjust the leakage magnetic field to the ferromagnetic layer 33.

The ferromagnetic layers 371 and 373 have ferromagnetic properties, and each have an easy axis of magnetization in a direction perpendicular to the film surface. The ferromagnetic layers 371 and 373 include, for example, cobalt (Co), and the non-magnetic layer 372 includes, for example, platinum (Pt) or palladium (Pd). Namely, the ferromagnetic layer 371, the non-magnetic layer 372, and the ferromagnetic layer 373 each are a multi-layered film in which cobalt (Co) and platinum (Pt) or palladium (Pd) are alternately stacked, and constitute a multilayer which has an fcc (111) crystal orientation and/or an hcp (0002) crystal orientation. The thickness of the non-magnetic layer 372 and the ferromagnetic layer 373 in a period is set, for example, to 0.2 nanometers or more and 0.6 nanometers or less. In contrast, for example, the thickness of the ferromagnetic layer 371 is set to approximately 0.7 nanometers (preferably, 0.5 nanometers or more and 1 nanometer or less). The thickness of the ferromagnetic layer 371 is set to be thicker than the ferromagnetic layer 373. Namely, if the thickness of the ferromagnetic layer 373 is set to be 0.5 nanometers or more and 0.6 nanometers or less, the thickness of the ferromagnetic layer 371 is set to be thicker than at least 0.6 nanometers. Accordingly, it is possible to improve the ability of the shift cancelling layer SCL to cancel the stray field of the reference layer RL.

1. 2 Manufacturing Method

Next, a method for manufacturing the magnetoresistive element of the magnetic storage device according to the first embodiment is described.

In the following, each layer constituting a tunnel barrier layer TB, a reference layer RL, a spacer layer SP, and a shift cancelling layer SCL of the magnetoresistive element MTJ is mainly described for the sake of convenience.

The stacked layers 37, the non-magnetic layer 36, the ferromagnetic layer 353, the non-magnetic layer 352, the ferromagnetic layer 351, and the non-magnetic layer 34 are stacked in the order given from the semiconductor substrate 20 side. If the non-magnetic layer 34 is magnesium oxide (MgO), the non-magnetic layer 34 is stacked in a state of a sodium chloride (NaCl) crystal structure in which the film surface is oriented to the (001) surface, and the non-magnetic layer 36 is stacked in a state of an fcc crystal structure. The ferromagnetic layers 351 and 353 and the non-magnetic layer 352 are stacked as an amorphous state. The ferromagnetic layer 353 may be stacked as, for example, a state merely including cobalt (Co) (i.e., a state not including iron (Fe) or boron (B)) when stacking. Each stacked layer is eliminated by etching using, for example, an ion beam, except the part which is intended to function as the magnetoresistive element MTJ.

Next, an annealing processing is performed to each of the stacked layers. Specifically, heat is applied externally to each layer for a predetermined period of time so that the ferromagnetic layer 351 is converted from the amorphous state to a crystalline substance. The non-magnetic layer 34 may function to control the orientation of the crystal structure of the ferromagnetic layer 351. Namely, the ferromagnetic layer 351 is crystallized by using the non-magnetic layer 34 as a seed. Accordingly, the ferromagnetic layer 351 is crystallized by reflecting the crystal surface of the non-magnetic layer 34. For example, if the non-magnetic layer 34 that is magnesium oxide (MgO), and the ferromagnetic layer 351 that is cobalt-iron-boron (CoFeB) are stacked, the cobalt-iron-boron (CoFeB) becomes a bcc (001) structure oriented to a (001) surface by reflecting the (001) surface of the magnesium oxide (MgO).

During the aforementioned annealing processing, the non-magnetic layer 352 and the ferromagnetic layer 353, which are in the amorphous state, suppress crystallization of the ferromagnetic layer 351 from the stacked layers 37 side. As described above, the non-magnetic layer 352 and the ferromagnetic layer 353 can allow the crystal orientation of the ferromagnetic layer 351 and the crystal orientation of the non-magnetic layer 36 to be discontinuous. In accordance with crystallization of the ferromagnetic layer 351, boron (B) in the ferromagnetic layer 351 is diffused in ambient layers (for example, non-magnetic layer 352 and ferromagnetic layer 353). The non-magnetic layer 352 and the ferromagnetic layer 353 can easily maintain the amorphous state by the presence of boron (B).

In addition, during the annealing processing, iron (Fe) in the ferromagnetic layer 351 may be diffused in the non-magnetic layer 352 and the ferromagnetic layer 353. As a result of diffusion, iron (Fe) in the stacked layers 35 consecutively diffused from the ferromagnetic layer 351 side to the ferromagnetic layer 353 side with the non-magnetic layer 352 is interposed, while a peak is exhibited in the ferromagnetic layer 351 side. Specifically, the atomic ratio of iron (Fe) in the ferromagnetic layer 353 becomes 15 at % or more and 25 at % or less. Accordingly, the amorphous state or the microcrystal state can be easily maintained in the ferromagnetic layer 353.

Molybdenum (Mo) or tungsten (W) in the non-magnetic layer 352 is difficult to be mixed with cobalt iron (CoFe) alloy included in layers above or below the non-magnetic layer 352 in comparison with other elements such as tantalum (Ta) that may be used for the function layer FL. Accordingly, diffusion of molybdenum (Mo) or tungsten (W) from the non-magnetic layer 352 to the ferromagnetic layer 351 is suppressed. Similarly, iridium (Ir) in the non-magnetic layer 36 has a higher melting temperature and is difficult to be diffused in comparison with the other elements such as ruthenium (Ru) generally used for the spacer layer SP. Accordingly, diffusion of iridium (Ir) from the non-magnetic layer 36 to the ferromagnetic layer 351 is suppressed. Thus, the ferromagnetic layer 351 can be crystallized with high quality.

Via the annealing processing, the ferromagnetic layer 351 is crystallized by reflecting the crystal orientation of the non-magnetic layer 34. The non-magnetic layer 352 and the ferromagnetic layer 353 maintain the amorphous state without being crystallized as an fcc crystal structure from the stacked layers 37 side. Specifically, after the annealing processing, the ferromagnetic layer 351 includes iron (Fe) more than the ferromagnetic layer 353. Accordingly, the Fe-rich ferromagnetic layer 351 can be crystallized to a bcc crystal system, and the Co-rich ferromagnetic layer 353 can maintain the amorphous state or the microcrystal state.

Next, for each layer in which the annealing processing has been finished, a magnetization processing is performed if necessary. Specifically, the stacked layers 37 is magnetized by externally applying a magnetic field of a degree sufficient for magnetizing the stacked layers 37 toward a predetermined direction. Accordingly, the stacked layers 35 is magnetized in the direction opposite to the stacked layers 37. Via this processing, the two stacked layers 35 and 37 respectively realize functions of the reference layer RL and the shift cancelling layer SCL.

The manufacturing of the magnetoresistive element MTJ is finished by the above processing.

1. 3 Advantageous Effects of Present Embodiment

According to the first embodiment, the film thickness of the magnetoresistive element can be reduced, and the tunnel magnetoresistive ratio can be improved. The advantageous effects of the present embodiment is discussed below.

According to the first embodiment, the stacked layers 35 functioning as the reference layer RL includes the ferromagnetic layer 351 which functions as an interface reference layer IRL, the non-magnetic layer 352 which functions as a function layer FL, and the ferromagnetic layer 353 which functions as a main reference layer MRL. The ferromagnetic layer 351 is disposed on the lower surface of the non-magnetic layer 34 functioning as a tunnel barrier layer TB, and includes iron (Fe) and cobalt (Co). The non-magnetic layer 352 is formed on the ferromagnetic layer 351 and on the ferromagnetic layer 353, is located between by the ferromagnetic layer 351 and the ferromagnetic layer 353, and includes molybdenum (Mo) or tungsten (W). The ferromagnetic layer 353 is disposed on the upper surface of the non-magnetic layer 36 functioning as a spacer layer SP, and includes iron (Fe) and cobalt (Co). As a result, the stacked layers 35 can be formed without using a multilayer in which platinum (Pt) or palladium (Pd) and cobalt (Co) are stacked as multiple layers. Accordingly, the number of layers of the stacked layers 35 can be reduced, thereby reducing the film thickness. Thus, constraints regarding the film thickness when etching the magnetoresistive element MTJ by an ion beam can be relaxed, thereby reducing the load in manufacturing. In addition, the stacked layers 35 can have a greater tunnel magnetoresistive ratio (TMR ratio) in comparison with the structure where platinum (Pt) or palladium (Pd) is included therein. This advantageous effect is described below with reference to FIGS. 6 and 7.

Figure 6:
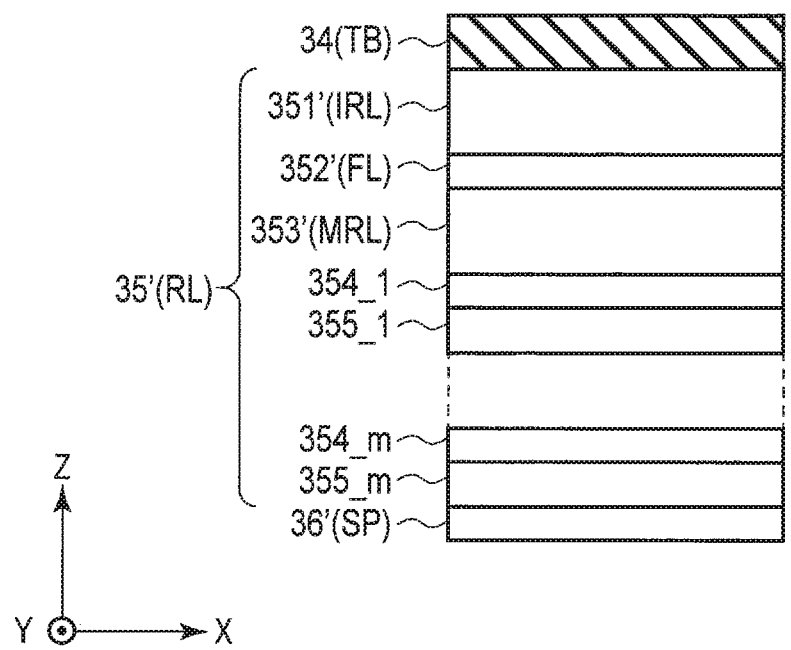
FIG. 6 is a sectional view to explain a detailed configuration of a part of a magnetic storage device which includes a reference layer and a shift cancelling layer, according to a comparative example.
Figure 7:
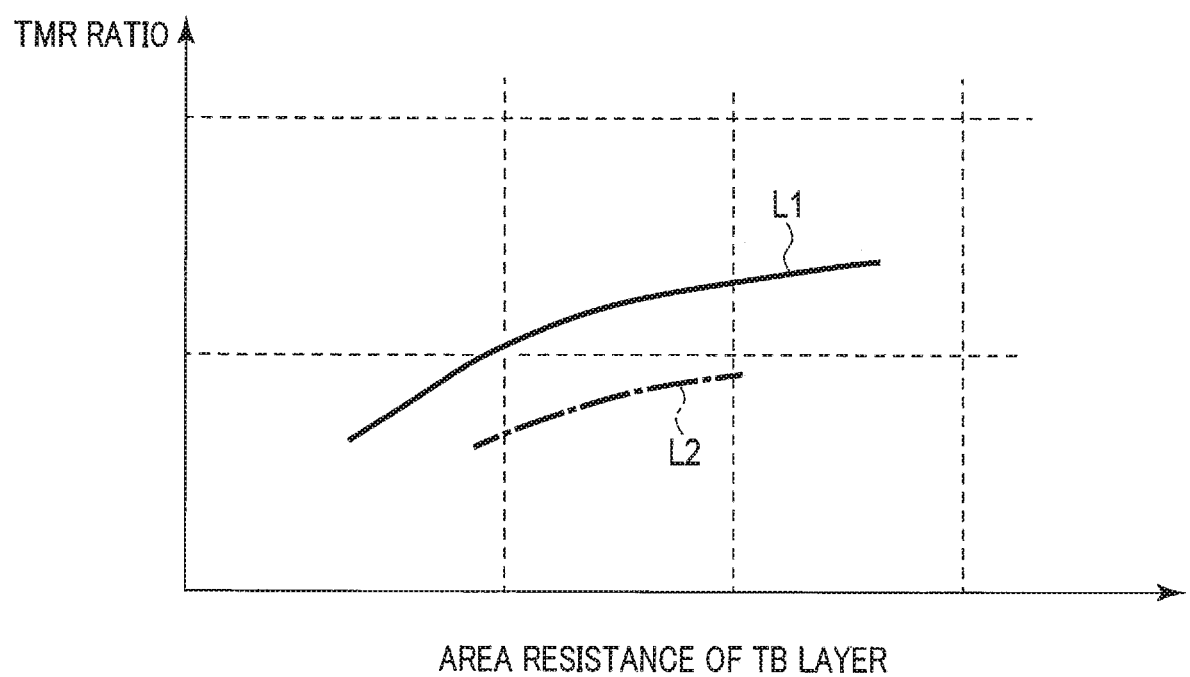
FIG. 7 is a diagram to explain a tunnel magnetoresistive ratio of the magnetoresistive element of the magnetic storage device according to the first embodiment.

FIG. 6 is a cross-sectional view to explain a configuration of the reference layer of a magnetoresistive element according to a comparative example. FIG. 6 shows the magnetoresistive element MTJ according to the comparative example, in which a non-magnetic layer 36' functioning as a spacer layer SP, a stacked layers 35' functioning as a reference layer RL, and a non-magnetic layer 34 functioning as a tunnel barrier layer TB are illustrated, and the remaining parts are omitted. FIG. 7 is a diagram to explain a tunnel magnetoresistive ratio of the magnetoresistive element of the magnetic storage device according to the first embodiment. In FIG. 7, the x-axis represents an area resistance of the tunnel barrier layer TB, and the y-axis represents a TMR ratio. The TMR ratio of the magnetoresistive element according to the first embodiment indicated by a solid line L1 is compared with the TMR ratio of the magnetoresistive element according to the comparative example indicated by an alternating long and short dashed line L2.

As shown in FIG. 6, the stacked layers 35' includes a ferromagnetic layer 353', a non-magnetic layer 352', and a ferromagnetic layer 351' formed in the order given from the semiconductor substrate 20 side. The ferromagnetic layers 351' and 353' include, for example, cobalt-iron-boron (CoFeB), and the non-magnetic layer 352' includes, for example, tantalum (Ta). The stacked layers 35' further includes a periodic structure of m-periods of non-magnetic layers 354 (354_1 to 354_m) and m-periods of ferromagnetic layers 355 (355_1 to 355_m) (m is any natural number) on the lower surface of the ferromagnetic layer 353'. The non-magnetic layer 354 includes platinum (Pt) or palladium (Pd), and the ferromagnetic layer 355 includes cobalt (Co). In this configuration, the stacked layers 35' has a structure where a layer such as a non-magnetic layer 354_1 that includes platinum (Pt) or palladium (Pd) is formed close to the ferromagnetic layer 351'. Via this configuration, the crystal orientation of the multilayer of the non-magnetic layer 354 and the ferromagnetic layer 355 may disturb crystallization to a structure having the (001) crystal orientation of the ferromagnetic layer 351'.

According to the first embodiment, a multilayer that includes platinum (Pt) or palladium (Pd) is not formed between the non-magnetic layer 352 and the non-magnetic layer 36. Thus, the ferromagnetic layer 353 can reduce influences from the multilayer when crystallization to the bcc crystal system, in comparison with the ferromagnetic layer 353'. Therefore, the ferromagnetic layer 351 can be crystallized with high quality, and thereby a TMR ratio greater than the comparative example can be obtained, as shown in FIG. 7.

In other words, the atomic ratio of iron (Fe) in the ferromagnetic layer 353 is lower than the atomic ratio of iron (Fe) in the ferromagnetic layer 351. In addition, the ferromagnetic layer 351 includes iron (Fe) in an atomic ratio of a range from 15 at % to 25 at % (both inclusive). Accordingly, the ferromagnetic layer 351 can have a Fe-rich composition in comparison with cobalt (Co), and the ferromagnetic layer 353 can have a Co-rich composition in comparison with iron (Fe). Thus, the ferromagnetic layer 351 can be maintained to be easier to be crystallized to the bcc crystal system, and the ferromagnetic layer 353 can be maintained to be in an amorphous state or a microcrystal state in which the ferromagnetic layer 353 is difficult to be crystallized from the stacked layers 37 side. In addition, by maintaining the ferromagnetic layer 353 to be in the amorphous state, the flatness of the film can be maintained in comparison with a case where the ferromagnetic layer 353 is crystallized.

The ferromagnetic layer 353 and the ferromagnetic layer 371 that sandwich the non-magnetic layer 36 between has a similar film thickness (0.5 nanometers or more and 1.0 nanometers or less). By forming the ferromagnetic layer 353 and the ferromagnetic layer 371 that sandwich the non-magnetic layer 36 between to be relatively thicker than the other ferromagnetic layers 373, the anti-ferromagnetic coupling strength through the non-magnetic layer 36 can be strong. Furthermore, it is possible to improve the function of the shift cancelling layer SCL to suppress the influence of the stray field of the reference layer RL by forming the ferromagnetic layer 371 having greater magnetization to be close to the reference layer RL.

2. Modifications

Various types of modifications are possible other than the first embodiment. In the following, some modifications applied to the first embodiment is described. The differences from the first embodiment are mainly described for the sake of convenience.

In the memory cell MC described in the first embodiment, the magnetoresistive element MTJ is disposed below the switching element SEL; however, the magnetoresistive element MTJ may be provided above the switching element SEL.

In the memory cell MC described in the first embodiment, a switch element between two terminals is adopted as the switching element SEL; however, a MOS (Metal Oxide Semiconductor) transistor may be adopted as the switching element SEL. Namely, the memory cell array is not limited to the cross-point structure, but may adopt any array structures.

FIG. 8 is a circuit diagram illustrating the configuration of a memory cell array of the magnetic storage device according to a modification. FIG. 8 corresponds to the memory cell array 10 of the magnetic storage device 1 shown in FIG. 1, according to the first embodiment.

As shown in FIG. 8, a memory cell array 10A includes a plurality of memory cells MC each associated with a set of a row and a column. Memory cells MC arranged in the same row are coupled to the same word line WL, and both ends of each of the memory cells MC arranged in the same column are coupled to the same bit line BL and the same source line/BL.

FIG. 9 is a cross-sectional view to explain a configuration of a memory cell of a magnetic storage device according to a modification. FIG. 9 corresponds to the memory cell MC described with reference to FIG. 3, according to the first embodiment. In an example shown in FIG. 9, the memory cells MC are not stacked onto the semiconductor substrate, and accordingly an additional symbol, "u" or "d", etc. is not added.

As shown in FIG. 9, the memory cell MC is disposed above the semiconductor substrate 40, and includes a selection transistor 41 (Tr) and a magnetoresistive element 42 (MTJ). The selection transistor 41 is disposed as a switch for controlling supplying and stopping a current at the time of writing and reading data relative to the magnetoresistive element 42. The configuration of the magnetoresistive element 42 is equivalent to the configuration shown in FIG. 4, according to the first embodiment.

The selection transistor 41 includes a gate (conductor 43) functioning as a word line WL, and a pair of regions (a source region and a drain region) (diffusion regions 44) disposed on the semiconductor substrate 40 at both ends along the X-direction of the gate. The conductor 43 is disposed on an insulator 45 functioning as a gate insulation film disposed on the semiconductor substrate 40. The conductor 43 extends, for example, along the Y-direction, and is commonly coupled to a gate of a selection transistor (not illustrated) of each of the other memory cells MC arranged along the Y-direction. The conductors 43 are arranged, for example, in the X-direction. A contact 46 is disposed on one of the diffusion regions 44 disposed at a first end of the select transistor 41. The contact 46 is coupled on the lower surface (first end) of the magnetoresistive element 42. A contact 47 is disposed on the upper surface (second end) of the magnetoresistive element 42, and a conductor 48 functioning as a bit line BL is coupled on the upper surface of the contact 47. The conductor 48 extends, for example, along the X-direction, and is commonly coupled to the second end of the magnetoresistive element (not illustrated) of each of the other memory cells arranged in the X-direction. A contact 49 is disposed on the other of the diffusion regions 44 disposed at a second end of the selection transistor 41. The contact 49 is coupled on the lower surface of the conductor 50 functioning as a source line/BL. The conductor 50 extends, for example, along the X-direction, and is commonly coupled to the second end of a selection transistor (not illustrated) of each of the other memory cells MC arranged along the X-direction. The conductors 48 and 50 are arranged, for example, in the Y-direction. The conductor 48 is, for example, placed above the conductor 50. Although not illustrated in FIG. 9, the conductors 48 and 50 are arranged to avoid physical and electrical interference. The selection transistor 41, the magnetoresistive element 42, the conductors 43, 48, and 50, and the contacts 46, 47 and 49 are covered with an interlayer insulation film 51. The other magnetoresistive elements (not illustrated) arranged along the X-direction or the Y-direction relative to the magnetoresistive element 42 are disposed, for example, on the same layer level. Namely, a plurality of magnetoresistive elements 42 are arranged, for example, on the XY plane within the memory cell array 10A.

Via the above configuration, the advantageous effects equivalent to the first embodiment can be accomplished in the case where a MOS transistor that is a switch between three terminals is adopted as the switching element SEL, instead of a switch between two terminals.

Furthermore, in the first embodiment and the modification, the magnetic storage device that includes an MTJ element is described as an example of the magnetic storage device that includes a magnetoresistive element; however, the magnetic storage device is not limited thereto. For example, the magnetic storage device includes other devices which require a magnetic element having perpendicular magnetic anisotropy such as a sensor, media, etc.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic storage device comprising:
   a magnetoresistive element,
   the magnetoresistive element including:
      first stacked layers;
      a first non-magnetic layer on the first stacked layers;
      second stacked layers on the first non-magnetic layer;
      a second non-magnetic layer on the second stacked layers; and
      a first magnetic layer on the second non-magnetic layer, and
   the second stacked layers including:
      a second magnetic layer being in contact with the second non-magnetic layer, and including iron (Fe) and cobalt (Co);
      a third non-magnetic layer at an opposite side of the second non-magnetic layer relative to the second magnetic layer, and including an element selected from molybdenum (Mo) or tungsten (W); and
      a third magnetic layer on the first non-magnetic layer, being in contact with the third non-magnetic layer, and including iron (Fe) and cobalt (Co),
   wherein an atomic ratio of iron (Fe) in the third magnetic layer is lower than an atomic ratio of iron (Fe) in the second magnetic layer, such that the third magnetic layer and the second magnetic layer have different crystallinities, and wherein the atomic ratio of iron (Fe) in the third magnetic layer is set such that the third magnetic layer has an amorphous structure or a microcrystal structure.

2. The device of claim 1, wherein:
the atomic ratio of iron (Fe) in the second magnetic layer is greater than an atomic ratio of cobalt (Co) in the second magnetic layer, and
an atomic ratio of cobalt (Co) in the third magnetic layer is greater than the atomic ratio of iron (Fe) in the third magnetic layer.

3. The device of claim 1, wherein:
the atomic ratio of iron (Fe) in the third magnetic layer is in a range from 15 at % to 25 at %.

4. The device of claim 1, wherein:
the third non-magnetic layer has an amorphous structure.

5. The device of claim 1, wherein:
the third non-magnetic layer further includes boron (B).

6. The device of claim 1, wherein:
the first non-magnetic layer includes iridium (Ir).

7. The device of claim 1, wherein:
the second stacked layers are above the first stacked layers.

8. The device of claim 1, wherein:
the first magnetic layer, the second non-magnetic layer, and the second magnetic layer form a magnetic tunnel junction.

9. The device of claim 8, wherein:
the second non-magnetic layer includes magnesium oxide (MgO).

10. A magnetic storage device comprising:
a magnetoresistive element,
the magnetoresistive element including:
  first stacked layers;
  a first non-magnetic layer on the first stacked layers;
  second stacked layers on the first non-magnetic layer;
  a second non-magnetic layer on the second stacked layers; and
  a first magnetic layer on the second non-magnetic layer,
the second stacked layers including:
  a second magnetic layer being in contact with the second non-magnetic layer, and including iron (Fe) and cobalt (Co);
  a third non-magnetic layer at an opposite side of the second non-magnetic layer relative to the second magnetic layer, and including an element selected from molybdenum (Mo) or tungsten (W); and
  a third magnetic layer on the first non-magnetic layer, being in contact with the third non-magnetic layer, and including iron (Fe) and cobalt (Co), and
the first stacked layers including:
  a fourth magnetic layer being in contact with the first non-magnetic layer; and
  a multi-layered film at an opposite side of the first non-magnetic layer relative to the fourth magnetic layer, in which a fourth non-magnetic layer and a fifth magnetic layer are alternately stacked,
wherein a film thickness of the fourth magnetic layer is greater than a film thickness of the fifth magnetic layer,
wherein the first non-magnetic layer includes iridium (Ir), and
wherein platinum (Pt) or palladium (Pd) is not included between the first non-magnetic layer and the third non-magnetic layer.

11. The device of claim 10, wherein:
the fourth magnetic layer is in contact with the fourth non-magnetic layer.

12. The device of claim 10, wherein:
the film thickness of the fourth magnetic layer is in a range from 0.5 nanometers to 1.0 nanometers.

13. The device of claim 12, wherein:
a film thickness of the third magnetic layer is substantially equal to the film thickness of the fourth magnetic layer.

14. The device of claim 13, wherein:
the fourth magnetic layer and the fifth magnetic layer include cobalt (Co), and
the fourth non-magnetic layer includes platinum (Pt).

15. The device of claim 10, wherein:
the second stacked layers are above the first stacked layers.

16. The device of claim 10, wherein:
the first magnetic layer, the second non-magnetic layer, and the second magnetic layer form a magnetic tunnel junction.

17. The device of claim 16, wherein:
the second non-magnetic layer includes magnesium oxide (MgO).

18. The device of claim 17, further comprising:
a memory cell that includes the magnetoresistive element and a switching element coupled to the magnetoresistive element in series.

* * * * *